(12) United States Patent
Chang et al.

(10) Patent No.: US 9,036,377 B2
(45) Date of Patent: May 19, 2015

(54) CONTROL CIRCUIT OF A SWITCHED-MODE POWER CONVERTER AND METHOD THEREOF

(75) Inventors: Yuan-Wen Chang, Hsin-Chu (TW); Ren-Yi Chen, Hsin-Chu (TW); Yi-Lun Shen, Hsin-Chu (TW)

(73) Assignee: Leadtrend Technology Corp., Science-Based Industrial Park, Hsin-Chu (TW)

( * ) Notice: Subject to any disclaimer, the term of this patent is extended or adjusted under 35 U.S.C. 154(b) by 173 days.

(21) Appl. No.: 13/470,354

(22) Filed: May 13, 2012

(65) Prior Publication Data

US 2012/0300499 A1    Nov. 29, 2012

(30) Foreign Application Priority Data

May 27, 2011    (TW) .............................. 100118582 A

(51) Int. Cl.
*H02M 3/335* (2006.01)
*G06F 1/00* (2006.01)
*H03K 3/84* (2006.01)
*H02M 1/36* (2007.01)
*H02M 3/156* (2006.01)
*H03K 4/502* (2006.01)

(52) U.S. Cl.
CPC . *H03K 3/84* (2013.01); *H02M 1/36* (2013.01); *H02M 3/156* (2013.01); *H03K 4/502* (2013.01)

(58) Field of Classification Search
CPC ................................. H02M 1/36; H02M 3/156
USPC ................. 323/282–285, 222–225, 271–275; 331/78, 177; 363/21.05–21.18, 41, 89
See application file for complete search history.

(56) References Cited

U.S. PATENT DOCUMENTS

| | | | | |
|---|---|---|---|---|
| 5,594,631 A | * | 1/1997 | Katoozi et al. | 363/41 |
| 6,191,676 B1 | * | 2/2001 | Gabor | 336/160 |
| 6,771,059 B1 | * | 8/2004 | Zwicker | 324/119 |
| 7,026,851 B2 | * | 4/2006 | Yang et al. | 327/172 |
| 7,177,166 B1 | * | 2/2007 | Kris | 363/41 |
| 7,239,532 B1 | * | 7/2007 | Hsu et al. | 363/21.12 |
| 7,388,444 B2 | * | 6/2008 | Liao | 331/143 |
| 7,388,764 B2 | * | 6/2008 | Huynh et al. | 363/21.16 |
| 7,493,504 B2 | * | 2/2009 | Chapuis | 713/300 |
| 8,421,431 B2 | * | 4/2013 | Chia | 323/288 |
| 2003/0072170 A1 | * | 4/2003 | Yang et al. | 363/41 |
| 2006/0031689 A1 | * | 2/2006 | Yang et al. | 713/300 |
| 2007/0047272 A1 | * | 3/2007 | Kris | 363/41 |
| 2008/0111714 A1 | * | 5/2008 | Kremin | 341/33 |
| 2009/0147550 A1 | * | 6/2009 | Yu | 363/49 |
| 2010/0008110 A1 | * | 1/2010 | Huang et al. | 363/21.18 |
| 2010/0103705 A1 | * | 4/2010 | Fang et al. | 363/21.18 |
| 2010/0106041 A1 | * | 4/2010 | Ghovanloo et al. | 600/544 |
| 2010/0237960 A1 | * | 9/2010 | Yeh et al. | 331/177 R |
| 2010/0275052 A1 | * | 10/2010 | Ku | 713/501 |
| 2011/0096574 A1 | * | 4/2011 | Huang | 363/21.18 |
| 2011/0110126 A1 | * | 5/2011 | Morrish | 363/21.18 |

(Continued)

*Primary Examiner* — Timothy J Dole
*Assistant Examiner* — Yusef Ahmed
(74) *Attorney, Agent, or Firm* — Winston Hsu; Scott Margo

(57) ABSTRACT

A method for controlling voltage crossing a power switch of a switched-mode power converter includes the steps of: controlling a switch frequency of the power switch of the switched-mode power converter to a first frequency as activating the switched-mode power converter; and then changing the switch frequency of the power switch to a second frequency after the switched-mode power converter is activated for a predetermined time; wherein the first frequency is lower than the second frequency.

6 Claims, 8 Drawing Sheets

(56) References Cited

U.S. PATENT DOCUMENTS

| | | | |
|---|---|---|---|
| 2011/0298416 A1* | 12/2011 | Singh et al. | 320/107 |
| 2012/0019329 A1* | 1/2012 | Yeh et al. | 331/78 |
| 2012/0043973 A1* | 2/2012 | Kremin | 324/658 |
| 2013/0106379 A1* | 5/2013 | Morrish | 323/282 |

\* cited by examiner

CONTROL CIRCUIT OF A SWITCHED-MODE POWER CONVERTER AND METHOD THEREOF

BACKGROUND OF THE INVENTION

1. Field of the Invention

The present invention relates to a control circuit and a method thereof, and particularly to a control circuit and a method thereof that can control voltage crossing a power switch of a switched-mode power converter.

2. Description of the Prior Art

A switched-mode power converter, also called a "switched-mode power supply" (SMPS), is an electronic power converter. The switched-mode power converter is used for converting and providing input power to a load. Generally speaking, a voltage level of the input power of the switched-mode power converter is different from a voltage level of output power of the switched-mode power converter. Compared to a linear power converter, the switched-mode power converter not only can provide higher power conversion efficiency, but can also have smaller area. In a transformer-coupled switched-mode power converter, the transformer-coupled switched-mode power converter utilizes a transformer to isolate a power input terminal from a power output terminal, where a side of the transformer near the power input terminal is called a primary side, and another side near the power output terminal is called a secondary side. The primary side of the transformer includes a switch for being controlled by pulse width modulation (PWM). The transformer-coupled switched-mode power converter is further divided into a forward switched-mode power converter and a flyback switched-mode power converter.

Please refer to FIG. 1. FIG. 1 is a diagram illustrating a flyback switched-mode power converter 100 according to the prior art. As shown in FIG. 1, the switched-mode power converter 100 mainly includes a rectifier 104, a transformer 106, a regulator 108, a photo coupler 110, a control circuit 112, and a power switch SW1. The switched-mode power converter 100 is coupled to an alternating current voltage source 102, and provides an approximate direct current voltage to the transformer 106 and the control circuit 112 by the rectifier 104. The control circuit 112 is used for providing a pulse width modulation signal $V_{OUT}$ to control the power switch SW1. The transformer 106 provides input power from a primary side to a secondary side by turning-on and turning-off of the power switch SW1. The regulator 108 and the photo coupler 110 are used for providing a feedback compensation signal $V_{COMP}$ of an output voltage of the switched-mode power converter 100 to the control circuit 112. The control circuit 112 can execute pulse width modulation operations by comparing the feedback compensation signal $V_{COMP}$ and current $I_P$ flowing through the power switch SW1.

However, the switched-mode power converter 100 in FIG. 1 has disadvantages as follows: when the switched-mode power converter 100 is activated, the output voltage of the secondary side starts to increase from a ground voltage level. A characteristic of the control circuit 112 can quickly increase speed of power conversion of the transformer 106. Therefore, the feedback compensation signal $V_{COMP}$ is a high voltage which causes the power switch SW1 to have a higher switch frequency.

Please refer to FIG. 2. FIG. 2 is a diagram illustrating a relationship between the feedback compensation signal $V_{COMP}$ and the current $I_P$ flowing through the power switch SW1 when the switched-mode power converter 100 is activated. As shown in FIG. 2, during a first switch period of the power switch SW1, a switch frequency of the power switch SW1 is higher, and time for turning-off of the power switch SW1 is shorter, resulting in the power switch SW1 entering a continuous mode during a second switch period of the power switch SW1. That is to say, the primary side of the transformer 106 can not discharge completely when the power switch SW1 enters a next switch period, so current $I_P$ flowing through the power switch SW1 gradually becomes larger. Because a voltage crossing the power switch SW1 is almost proportional to the current $I_P$, the higher current $I_P$ may result in the voltage crossing the power switch SW1 being so high as to damage itself.

Therefore, those skilled in the art need a method for controlling voltage crossing a power switch of a switched-mode power converter and a circuit thereof, and the method should effectively control the voltage crossing the power switch of the switched-mode power converter to prevent the power switch from being damaged when the switched-mode power converter is activated.

SUMMARY OF THE INVENTION

An embodiment provides a method for controlling voltage crossing a power switch of a switched-mode power converter. The method includes Steps as follows: controlling a switch frequency of a power switch of the switched-mode power converter to a first frequency when the switched-mode power converter is activated; and changing the switch frequency of the power switch to a second frequency after a predetermined time. The first frequency first frequency is lower than the second frequency.

Another embodiment provides a method for controlling voltage crossing a power switch of a switched-mode power converter. The method includes Steps as follows: controlling a switch frequency of a power switch of the switched-mode power converter according to a first voltage signal when the switched-mode power converter is activated; and controlling the switch frequency of the power switch according to a second voltage signal after the first voltage signal becomes greater than a threshold value.

Another embodiment provides a control circuit of a switched-mode power converter. The control circuit includes a multiplexer, a clock generator, and a pulse width modulation controller. The multiplexer is used for providing an output signal with a low voltage level when activated, and providing the output signal with a high voltage level after being activated for a period of time. The clock generator is used for providing a clock signal according to the output signal of the multiplexer. The pulse width modulation controller is used for providing a pulse width modulation signal according to the clock signal.

These and other objectives of the present invention will no doubt become obvious to those of ordinary skill in the art after reading the following detailed description of the preferred embodiment that is illustrated in the various figures and drawings.

DETAILED DESCRIPTION

The present invention provides a control circuit of a switched-mode power converter and a method for controlling voltage crossing a power switch of a switched-mode power converter that can utilize pulse width modulation and pulse frequency modulation to solve a problem of the voltage crossing the power switch of the switched-mode power converter being too high when the switched-mode power converter is activated.

Figure 3:
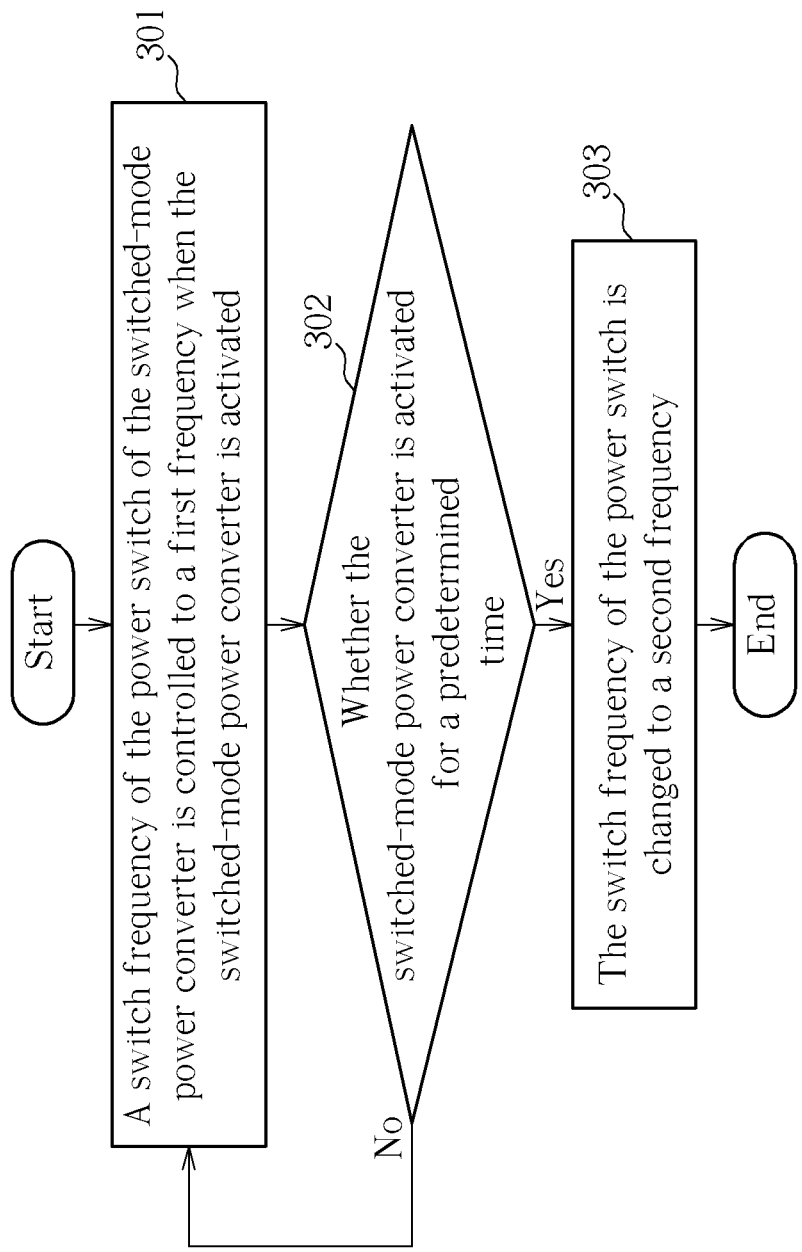
FIG. 3 is a flowchart illustrating the method for controlling voltage crossing the power switch of the switched-mode power converter according to an embodiment.

Please refer to FIG. 3. FIG. 3 is a flowchart illustrating the method for controlling voltage crossing the power switch of the switched-mode power converter according to an embodiment. In Step 301, a switch frequency of the power switch of the switched-mode power converter is controlled to a first frequency when the switched-mode power converter is activated, then go to Step 302. In Step 302, it is determined whether the switched-mode power converter is activated for a predetermined time. If yes, go to Step 303; if no, go to Step 301. In Step 303, the switch frequency of the power switch is changed to a second frequency, where the first frequency is lower than the second frequency.

Figure 2:
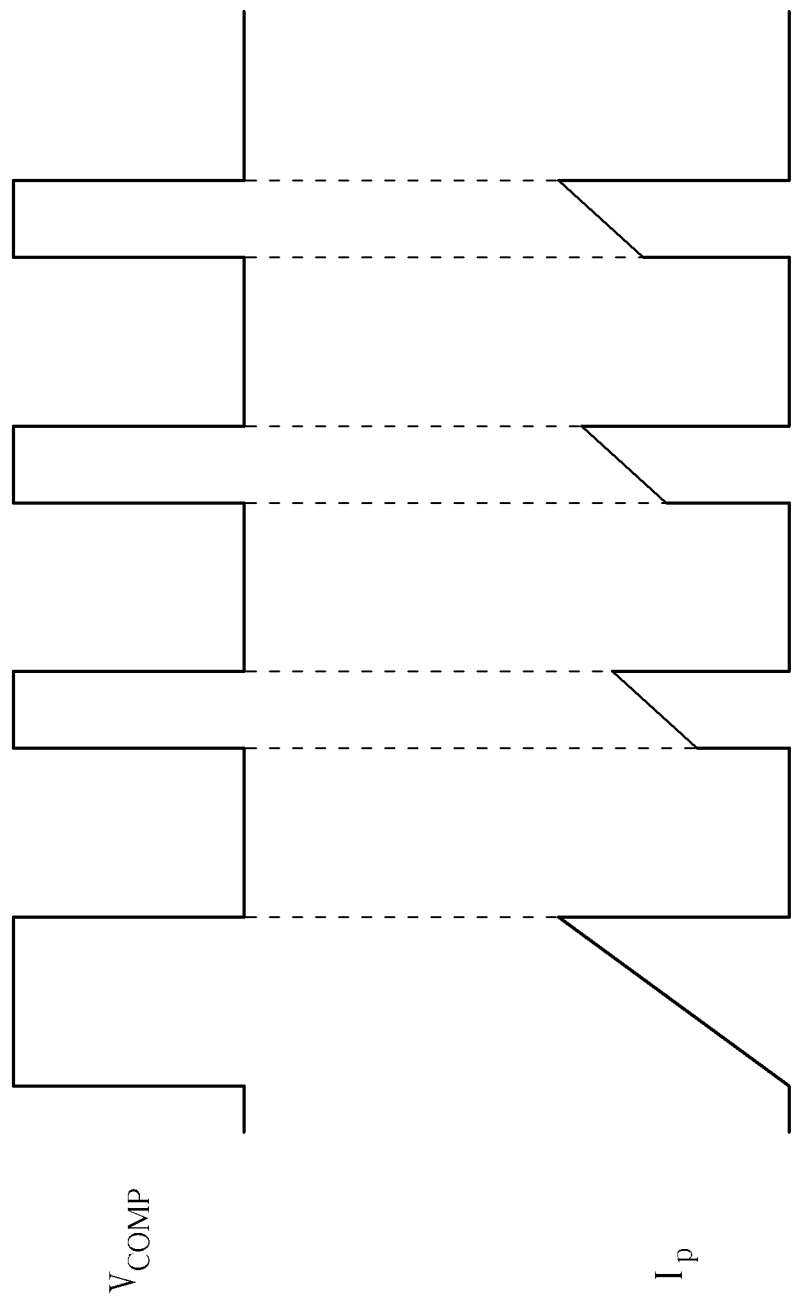
FIG. 2 is a diagram illustrating a relationship between the feedback compensation signal and the current flowing through the power switch SW1 when the switched-mode power converter is activated.
Figure 4:
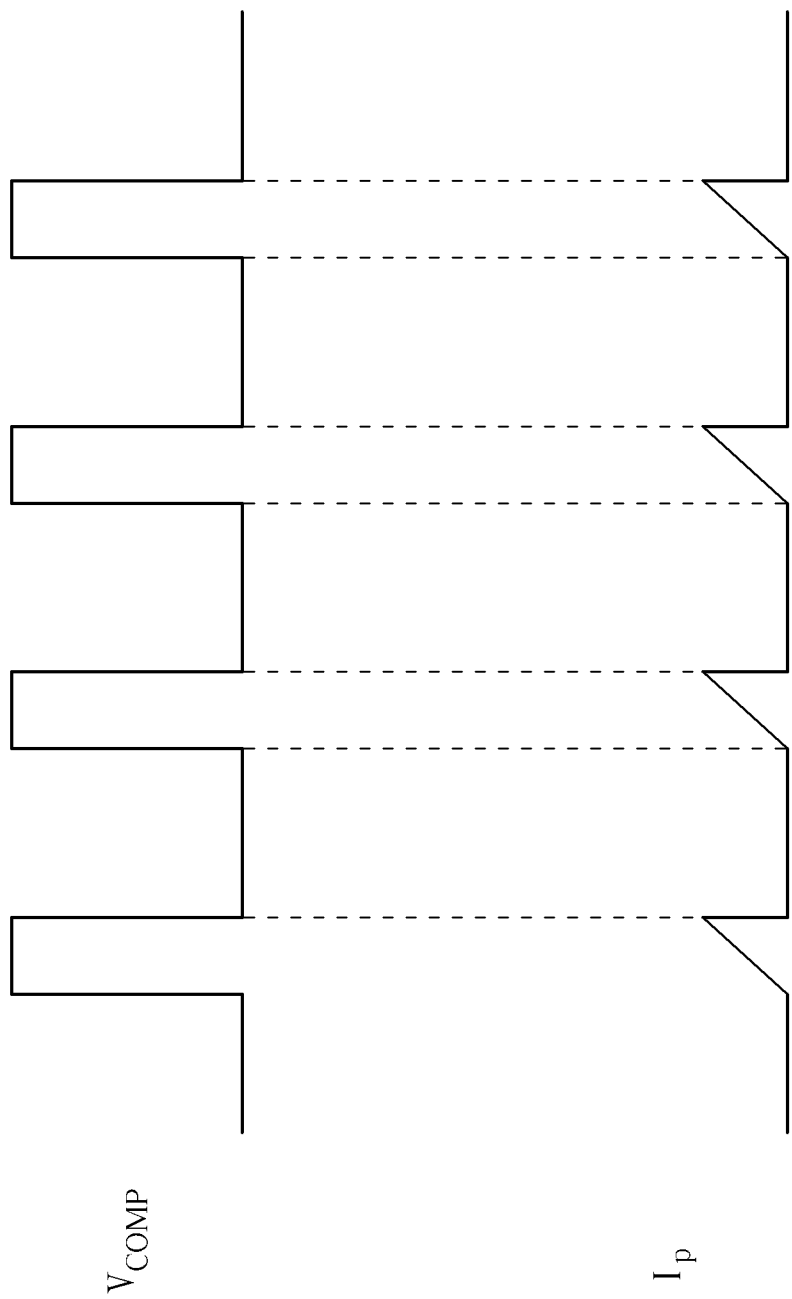
FIG. 4 is a diagram illustrating a relationship between a feedback compensation signal and current flowing through the power switch when the switched-mode power converter is activated according to the method in FIG. 3.

Please refer to FIG. 4. FIG. 4 is a diagram illustrating a relationship between a feedback compensation signal $V_{COMP}$ and current $I_P$ flowing through the power switch when the switched-mode power converter is activated according to the method in FIG. 3. As shown in FIG. 4, compared to the relationship in FIG. 2, the switch frequency (that is, the first frequency) when the power switch is activated is slower, and time for turning-off of the power switch is longer. Therefore, a transformer of the switched-mode power converter can discharge completely during turning-off of the power switch, and not enter a continuous mode. After the predetermined time, the power switch is free from damage risk. Then, the switch frequency of the power switch is switched to the second frequency higher than the first frequency to increase speed of power conversion of the transformer.

Figure 1:
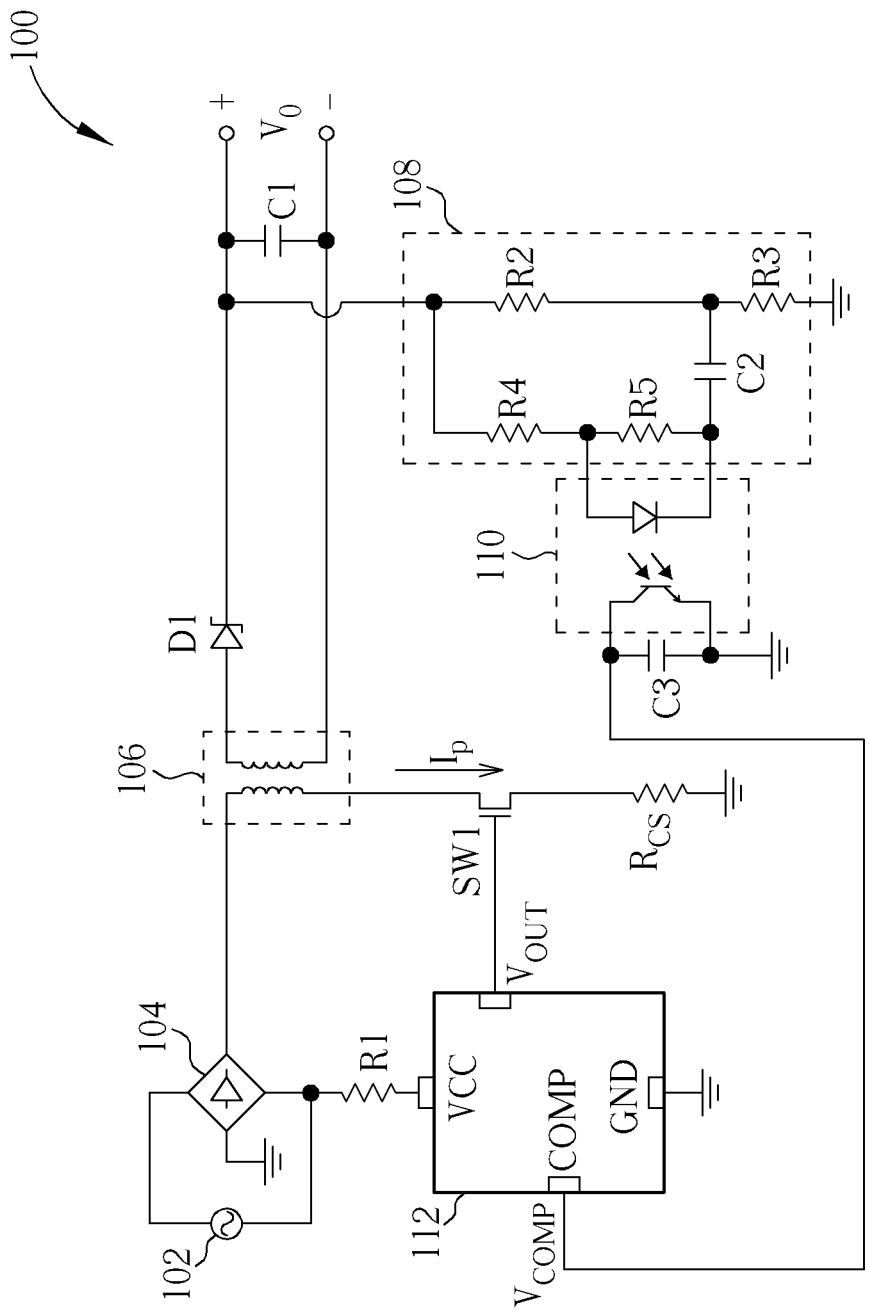
FIG. 1 is a diagram illustrating a flyback switched-mode power converter according to the prior art.
Figure 5:
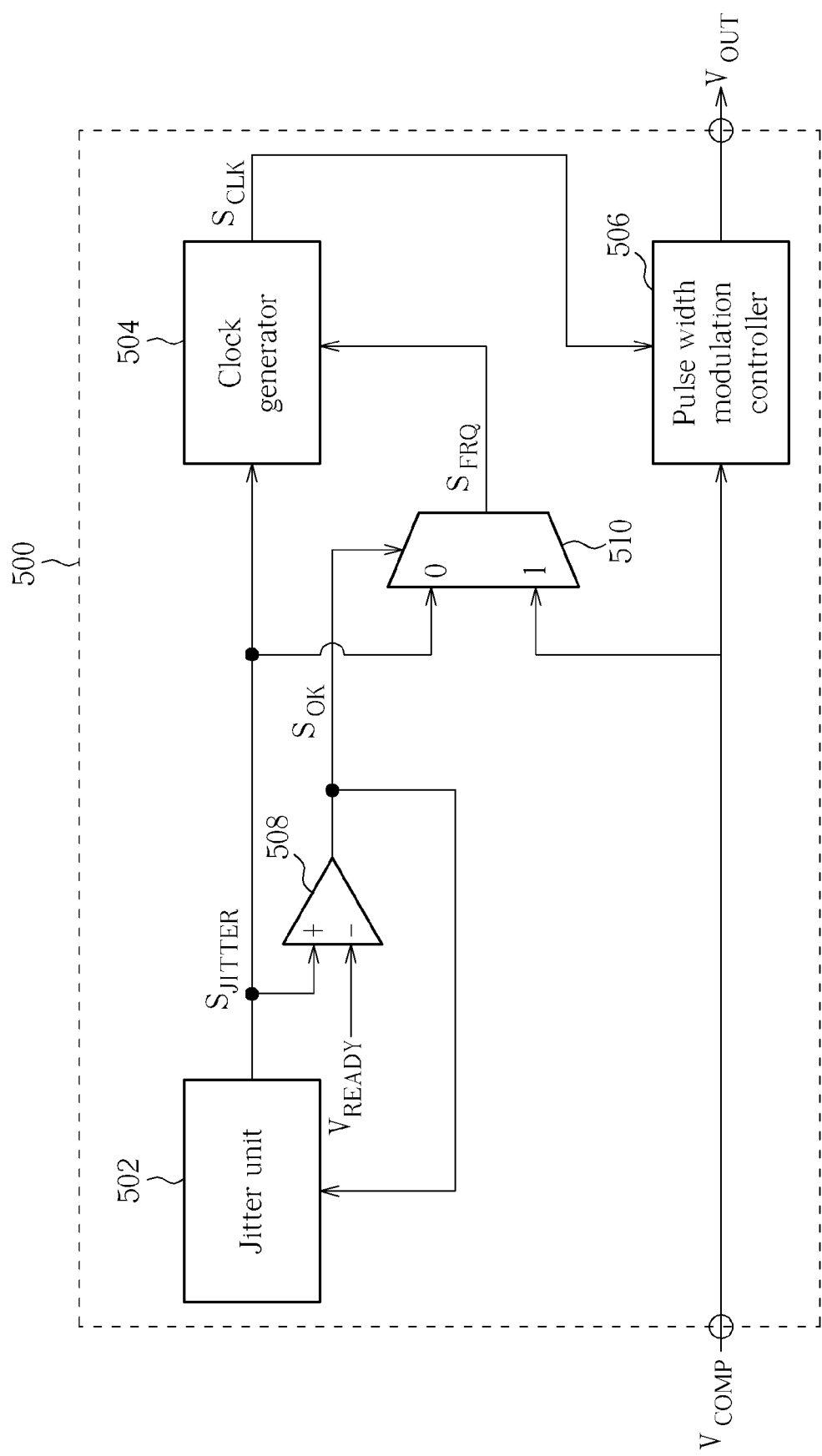
FIG. 5 is a diagram illustrating a controller of the switched-mode power converter according to an embodiment.

Please refer to FIG. 5. FIG. 5 is a diagram illustrating a controller 500 of the switched-mode power converter according to an embodiment, where the controller 500 can be used for implementing the method in FIG. 3, and for substituting for the control circuit 112 in FIG. 1. As shown in FIG. 5, the control circuit 500 includes a jitter unit 502, a clock generator 504, a pulse width modulation controller 506, a comparator 508, and a multiplexer 510. The jitter unit 502 is used for providing a jitter signal $S_{JITTER}$. The clock generator 504 is used for providing a clock $S_{CLK}$ required by the pulse width modulation controller 506, that is, the clock $S_{CLK}$ is the switch frequency of the power switch SW1. The pulse width modulation controller 506 is used for providing a pulse width modulation signal $V_{OUT}$ required by the power switch SW1. The comparator 508 is used for comparing the jitter signal $S_{JITTER}$ with a reference signal $V_{READY}$. The multiplexer 510 is used for providing the jitter signal $S_{JITTER}$ or the feedback compensation signal $V_{COMP}$ to the clock generator 504 according to an output signal $S_{OK}$ (of the comparator 508.

The clock generator 504 can obtain a frequency of the clock $S_{CLK}$ according to an input signal $S_{FRQ}$, and slowly execute frequency oscillation of the clock $S_{CLK}$ by the jitter signal $S_{JITTER}$. In a normal mode, the jitter signal $S_{JITTER}$ is greater than the reference signal $V_{READY}$, so the output signal $S_{OK}$ (of the comparator 508 is logic "1". Then, the clock generator 504 can obtain the frequency of the clock $S_{CLK}$ according to the feedback compensation signal $V_{COMP}$. However, the jitter signal $S_{JITTER}$ is gradually increased from a ground voltage level to the reference signal $V_{READY}$ when the switched-mode power converter is activated. During the jitter signal $S_{JITTER}$ being gradually increased from the ground voltage level to the reference signal $V_{READY}$, the output signal $S_{OK}$ (of the comparator 508 is logic "0", and the clock generator 504 can obtain the frequency of the clock $S_{CLK}$ according to the jitter signal $S_{JITTER}$. After the jitter signal $S_{JITTER}$ exceeds the reference signal $V_{READY}$, the clock generator 504 is controlled by the feedback compensation signal $V_{COMP}$ again. Preferably, a time (that is, the predetermined time in Step 302) for the jitter signal $S_{JITTER}$ exceeding the reference signal $V_{READY}$ can be controlled by adjusting the reference signal $V_{READY}$. For example, through setting the reference signal $V_{READY}$, the jitter signal $S_{JITTER}$ can exceed the reference signal $V_{READY}$ after the current of the power switch SW1 reaches a threshold value.

Figure 6:
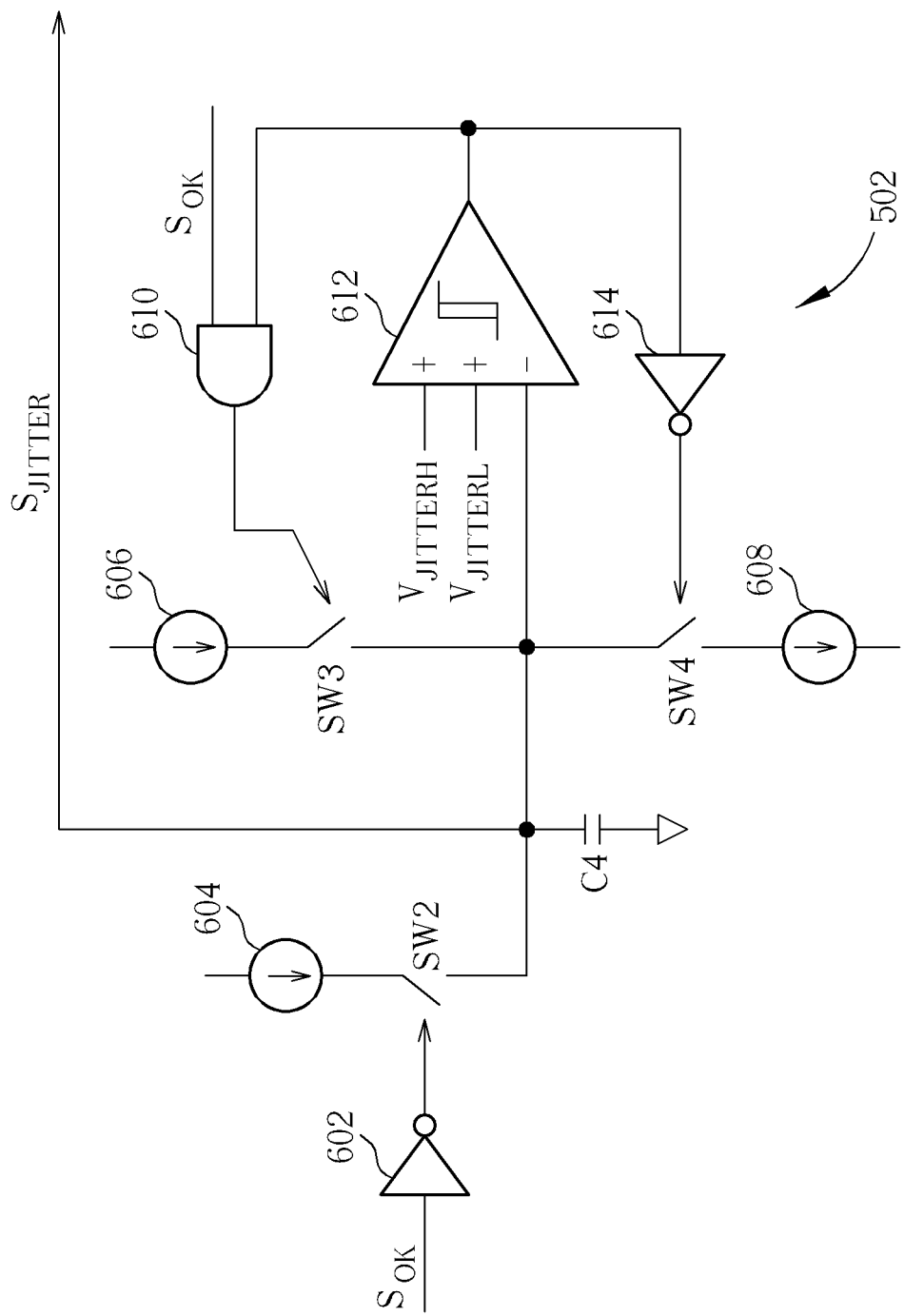
FIG. 6 is a diagram illustrating the jitter unit according to an embodiment.

Please refer to FIG. 6. FIG. 6 is a diagram illustrating the jitter unit 502 according to an embodiment. As shown in FIG. 6, the jitter unit 502 includes inverters 602, 614, current sources 604, 606, and 608, an AND gate 610, a hysteresis comparator 612, switches SW2, SW3, and SW4, and a capacitor C4. As shown above, when the jitter unit 502 is activated, the switch SW2 is turned on, and the switches SW3, SW4 are turned off because the input signal $S_{OK}$ is the logic "0". Therefore, the current source 604 charges the capacitor C4, and the jitter signal $S_{JITTER}$ of the jitter unit 502 is gradually increased from the ground voltage level. When the jitter signal $S_{JITTER}$ becomes greater than the reference signal $V_{READY}$, the switch SW2 is turned off and the hysteresis comparator 612 can alternately turn on the switches SW3 and SW4 according to the jitter signal $S_{JITTER}$ and saturation voltages $V_{JITTERH}$ and $V_{JITTERL}$. Therefore, the jitter signal $S_{JITTER}$ can be a waveform which moves slowly up and down between the saturation voltage $V_{JITTERH}$ and the saturation voltage $V_{JITTERL}$.

Figure 7:
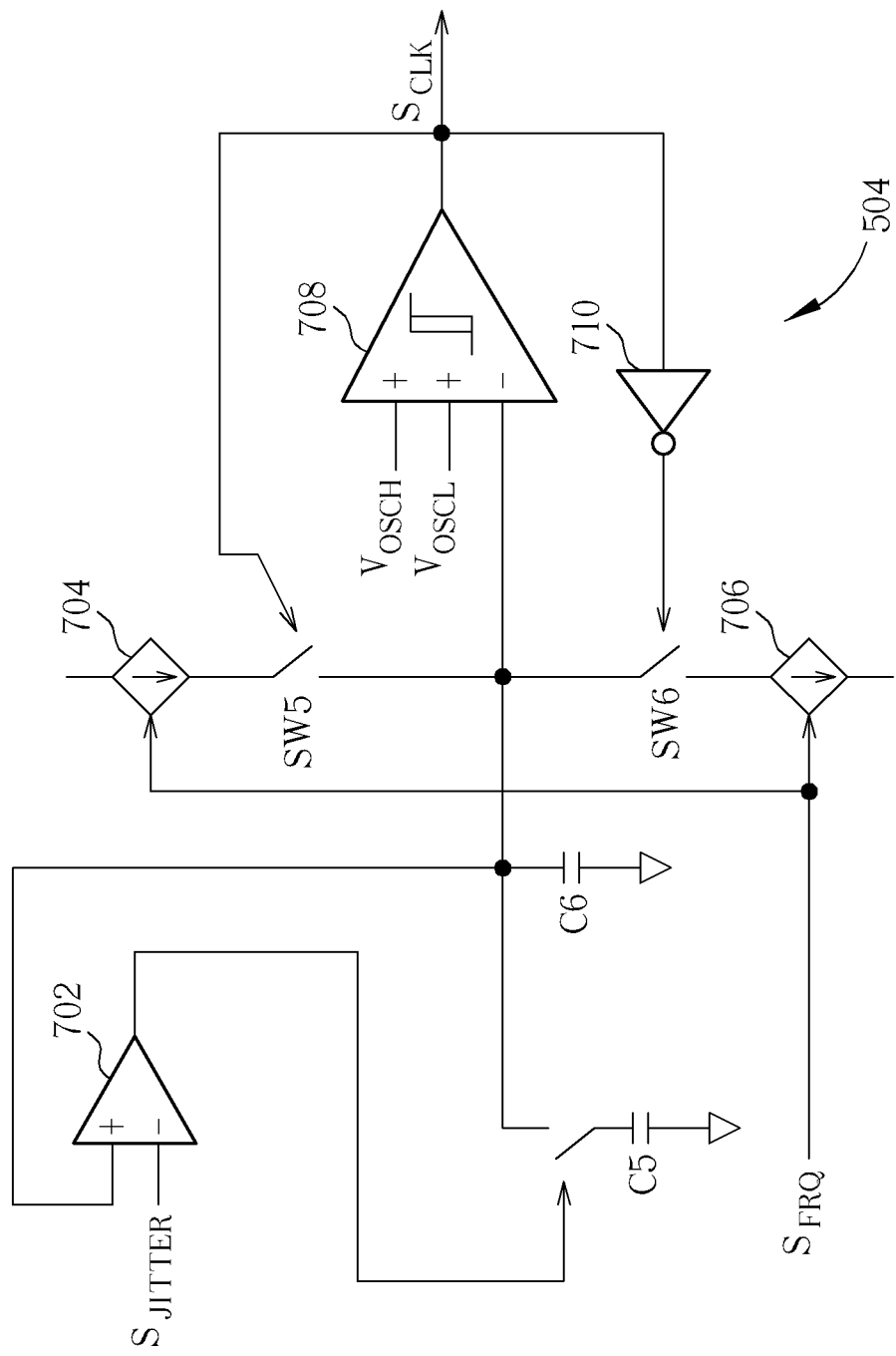
FIG. 7 is a diagram illustrating the clock generator according to an embodiment.

Please refer to FIG. 7. FIG. 7 is a diagram illustrating the clock generator 504 according to an embodiment. As shown in FIG. 7, the clock generator 504 includes a comparator 702, current sources 704, 706, a hysteresis comparator 708, an inverter 710, capacitors C5, C6, and switches SW5, SW6. The input signal $S_{FRQ}$ of the clock generator 504 mainly controls driving capability of the current sources 704 and 706, so the greater the input signal $S_{FRQ}$, the stronger the driving capability of the current sources 704 and 706. The comparator 702 turns on the switch SW5 to redistribute charges stored in the capacitors C5 and C6 according to the jitter signal $S_{JITTER}$. The hysteresis comparator 708 can alternately turn on the switches SW5 and SW6 according to a voltage of the capacitor C6 and reference voltages $V_{OSCH}$ and $V_{OSCL}$. As shown above, when the clock generator 504 is activated, the input signal $S_{FRQ}$ is the jitter signal $S_{JITTER}$. Due to a voltage level of the jitter signal $S_{JITTER}$ being lower, the driving capability of the current sources 704 and 706 is weaker, resulting in the frequency of the clock $S_{CLK}$ of the clock generator 504 (that is, the first frequency) being lower. After the jitter signal $S_{JITTER}$ exceeds the reference signal $V_{READY}$, the input signal $S_{FRQ}$ is changed to the feedback compensation signal $V_{COMP}$, so the driving capability of the current sources 704 and 706 becomes stronger, resulting in the frequency of the clock $S_{CLK}$ of the clock generator 504 (that is, the second frequency) being higher.

Figure 8:
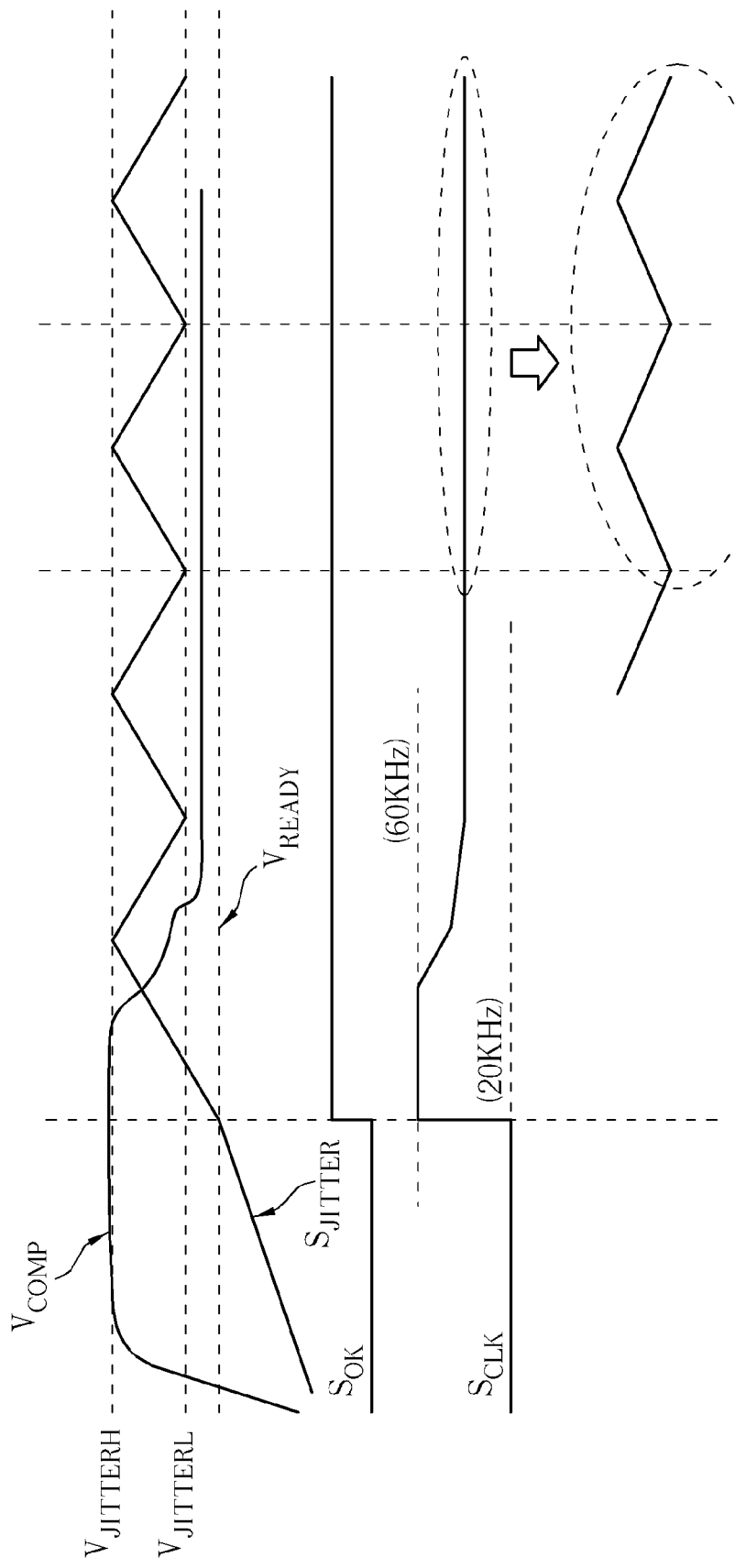
FIG. 8 is a diagram illustrating a waveform of the switched-mode power converter in FIG. 5 and FIG. 7 and waveforms of the jitter unit and the clock generator thereof.

Please refer to FIG. 8. FIG. 8 is a diagram illustrating a waveform of the switched-mode power converter in FIG. 5 and FIG. 7, and waveforms of the jitter unit and the clock generator thereof. As shown in FIG. 8, the feedback compensation signal $V_{COMP}$ is quickly increased to the saturation voltage $V_{JITTERH}$ and the jitter signal $S_{JITTER}$ is gradually increased from the ground voltage level after the switched-mode power converter is activated. Meanwhile, the input signal $S_{FRQ}$ of the clock generator 504 is the jitter signal $S_{JITTER}$. Because the jitter signal $S_{JITTER}$ is below a variation range of the clock generator 504, the clock generator 504 outputs a lowest predetermined clock, resulting in the switch frequency of the power switch SW1 being a lowest switch frequency (20 KHz). After the jitter signal $S_{JITTER}$ becomes greater than reference signal $V_{READY}$, the feedback compensation signal $V_{COMP}$ is still at the saturation voltage $V_{JITTERH}$. Meanwhile, the input signal $S_{FRQ}$ of the clock generator 504 is changed to the feedback compensation signal $V_{COMP}$, and the clock generator 504 outputs a highest predetermined clock, because the input signal $S_{FRQ}$ is higher than the variation range of the clock generator 504, resulting in the switch frequency of the power switch SW1 being a highest switch frequency (60 KHz). After the power switch SW1 stays at the highest switch frequency for a period of time, the feedback compensation signal $V_{COMP}$ is gradually decreased to a range between the highest switch frequency (the second frequency) and the lowest switch frequency (the first frequency), so that the control circuit 500 can operate normally. In addition, as shown by an arrow in FIG. 8, the jitter signal $S_{JITTER}$ can make the frequency of the clock $S_{CLK}$ of the clock generator 504 slowly oscillate upward and downward.

To sum up, the control circuit of the switched-mode power converter and the method for controlling voltage crossing the power switch of the switched-mode power converter utilize the pulse width modulation and the pulse frequency modulation to solve a problem of the voltage crossing the power switch of the switched-mode power converter being too high when the switched-mode power converter is activated.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A control circuit of a switched-mode power converter, the control circuit comprising:
    a multiplexer for providing an output signal with a low voltage level when activated in start-up, and providing the output signal with a high voltage level after being activated for a period of time;
    a clock generator for providing a clock signal according to the output signal of the multiplexer;
    a pulse width modulation controller for providing a pulse width modulation signal according to the clock signal;
    a jitter unit for providing a jitter signal to the clock generator, wherein the jitter unit comprises:
        a first capacitor, wherein a voltage level thereof is the jitter signal;
        a first current source for charging the first capacitor when the jitter signal is less than the reference signal;
        a first switch coupled to a second current source, wherein the second current source charges the first capacitor when the first switch is turned on;
        a second switch coupled to a third current source, wherein the third current source discharges the first capacitor when the second switch is turned on; and
        a first hysteresis comparator having an input terminal coupled to the first capacitor, a first reference voltage, and a second reference voltage, wherein the first hysteresis comparator is used for alternatingly turning on the first switch and the second switch when the jitter signal is greater than the reference signal; and
    a comparator for comparing the jitter signal with a reference signal to control the multiplexer;
    wherein the output signal with the low voltage level is according to the jitter signal.

2. The control circuit of claim 1, wherein the clock generator comprises:
    a second capacitor;
    a third switch coupled to a fourth current source, wherein the fourth current source charges the second capacitor when the third switch is turned on;
    a fourth switch coupled to a fifth current source, wherein the fifth current source discharges the second capacitor when the fourth switch is turned on; and
    a second hysteresis comparator having an input terminal coupled to the second capacitor, a third reference voltage, and a fourth reference voltage, wherein the second hysteresis comparator is used for providing the clock signal, and alternately turning on the third switch and the fourth switch according to the clock signal.

3. The control circuit of claim 2, wherein the clock generator further comprises:
    a third capacitor; and
    a comparator for redistributing charges stored in the second capacitor and the third capacitor according to the jitter signal.

4. The control circuit of claim 1, wherein the output signal with the high voltage level is according to a feedback compensation signal and the jitter signal.

5. The control circuit of claim 1, wherein the output signal with the low voltage level is a clock signal which makes the clock generator output a lowest frequency.

6. The control circuit of claim 1, wherein the output signal with the high voltage level is a clock signal which makes the clock generator output a highest frequency.

* * * * *